United States Patent
Park

(10) Patent No.: US 7,232,727 B2
(45) Date of Patent: Jun. 19, 2007

(54) METHOD FOR FABRICATING SEMICONDUCTOR DEVICE WITH RECESSED CHANNEL REGION

(75) Inventor: Soo-Young Park, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 124 days.

(21) Appl. No.: 11/030,438

(22) Filed: Dec. 22, 2004

(65) Prior Publication Data

US 2005/0250284 A1 Nov. 10, 2005

(30) Foreign Application Priority Data

May 6, 2004 (KR) .................... 10-2004-0031938

(51) Int. Cl.
*H01L 21/336* (2006.01)
(52) U.S. Cl. .................. 438/270; 438/259; 438/271
(58) Field of Classification Search ............... 438/270, 438/271, 259
See application file for complete search history.

(56) References Cited

U.S. PATENT DOCUMENTS 6,071,809 A * 6/2000 Zhao ..................... 438/634
6,277,707 B1 8/2001 Lee et al.
6,518,145 B1 2/2003 Alsmeier et al.

FOREIGN PATENT DOCUMENTS

KR 20010038753 5/2001
KR 20030082824 10/2003

OTHER PUBLICATIONS

"The Breakthrough in data retention of DRAM using Recess-Channel-Array Transistor (RCAT) FOR 88nm feature size and beyond", J. Kim, et al., 2003 Symposium on VLSI Technology Digest of Technical Papers, 2 pages.

* cited by examiner

*Primary Examiner*—Douglas M. Menz
(74) *Attorney, Agent, or Firm*—Blakely Sokoloff Taylor & Zafman

(57) ABSTRACT

Disclosed is a method for fabricating a semiconductor device with a plurality of recessed channel regions. This method includes the steps of: forming a plurality of device isolation layers in a substrate; forming a hard mask nitride layer, a hard mask oxide layer and a hard mask polysilicon layer on the device isolation and the substrate, thereby obtaining a hard mask pattern; forming a plurality of trenches in the predetermined regions of the substrate with use of the hard mask pattern to expose a plurality of recessed channel regions; selectively removing the hard mask pattern; and forming a plurality of gate structures in the plurality of trenches.

8 Claims, 5 Drawing Sheets

METHOD FOR FABRICATING SEMICONDUCTOR DEVICE WITH RECESSED CHANNEL REGION

FIELD OF THE INVENTION

The present invention relates to a method for fabricating a semiconductor device; and more particularly, to a method for fabricating a semiconductor using a recessed channel array transistor (RCAT) technology.

DESCRIPTION OF RELATED ARTS

As a scale of integration and fineness of a semiconductor device has increased, required process capability and reliability have been increased as well. Especially, in case of a dynamic random access memory (DRAM), a property of a transistor is determined by a shallow trench isolation (STI) process and a process for forming a gate structure. This property of the transistor is the most important factor to determine overall stability of the DRAM. Accordingly, it should be secured to improve stability of the STI process and the process for forming the gate structure to increase the overall reliability of the DRAM.

The STI process is one of the device isolation methods of a semiconductor device. That is, a trench is formed on a silicon substrate and then, the inside of the trench is filled with insulation materials such as an oxide layer. As a result, an effective isolation length is extended even in the same isolation width. Therefore, the STI process is a technology to obtain a smaller isolation region compared with device isolation by a local oxidation of silicon (LOCOS) process.

Recently, a technology of a recessed channel array transistor (RCAT) is suggested to improve a refreshing property during fabricating the DRAM.

FIGS. 1A to 1C are cross-sectional views illustrating a conventional method for fabricating a semiconductor device by using a RCAT technology.

Referring to FIG. 1A, a plurality of device isolation layers 12 having a STI structure is formed on a substrate 11. Afterwards, a hard mask oxide layer 13 and a hard mask polysilicon layer 14 are sequentially deposited on an upper portion of the substrate 11. Herein, the hard mask oxide layer 13 and the hard mask polysilicon layer 14 are used as hard masks for forming a plurality of recessed channel regions.

Next, a photosensitive layer is deposited on the hard mask polysilicon layer 14 and then, a mask 15 for forming the recessed channel is formed by patterning the photosensitive layer through photo exposing and developing processes.

Subsequently, the hard mask polysilicon layer 14 and the hard mask oxide layer 13 are etched by using the mask 15 as an etch barrier, thereby exposing a plurality of recessed channel regions in predetermined regions of the substrate 11.

Referring to FIG. 1B, the plurality of exposed recessed channel regions in the predetermined regions is etched in a predetermined thickness, thereby forming a plurality of trenches 16. During forming the plurality of trenches 16, the mask 15 is all used up and the hard mask oxide layer 13 and the hard mask polysilicon layer 14 remain.

Referring to FIG. 1C, the hard mask oxide layer 13 and the hard mask polysilicon layer 14 are removed through a wet etching process.

Next, a plurality of gate oxide layers 17 are formed in a manner to surround the plurality of trenches 16. Afterwards, a plurality of conductive layers are deposited on the plurality of gate oxide layers 17 to fill the plurality of trenches 16.

Subsequently, the conductive layers for the plurality of gate structures and the plurality of gate oxide layers 17 are selectively patterned, thereby forming a plurality of gate structures 18. At this time, each of the plurality of gate structures 18 includes a lower region buried in the trench and an upper region projected over the upper portion of the substrate 11. Accordingly, the plurality of recessed channel regions are formed by the lower region of the gate structure.

Next, a plurality of source/drain regions 19 are formed on the substrate 11 by performing an ion implantation.

However, when removing the hard masks, i.e., the hard mask oxide layer 13 and the hard mask polysilicon layer 14, used for forming the plurality of trenches 16 where the recessed channel region is formed, a plurality of moats M are generated in a plurality of top corner edges of the plurality of device isolation layers 12 in accordance with the conventional method.

FIG. 2A is a cross-sectional view illustrating a plurality of moats M generated according to the conventional method and FIG. 2B is a cross-sectional view illustrating remaining layers used for forming a plurality of gate structures in accordance with the conventional method.

Referring to FIG. 2A, after removing the hard mask oxide layer 13, a plurality of moats M are generated with surfaces lower than a surface of an active region at a plurality of top corner edges of the device isolation layers.

These plurality of moats M are generated as the plurality of device isolation layers 12 that are oxide layers are wet etched when the hard mask oxide layer 13 is removed through the wet etching process. Also, there is a problem of making a depth of the plurality of moats M deeper by being additionally wet etched during a cleaning process performed before formation of the plurality of the gate oxide layers.

Referring to FIG. 2B, when forming the plurality of gate structures by etching the conductive layer for forming the plurality of gate structures, it is difficult to etch up to the conductive layer 18A existing in the plurality of moats M. Herein, if the conductive layer for forming the plurality of gate structures 18A remains in the plurality of moats M, a short circuit between conductive patterns can be induced.

SUMMARY OF THE INVENTION

It is, therefore, an object of the present invention to provide a method for fabricating a semiconductor device with a plurality of recessed channel regions capable of minimizing a depth of a moat generated when removing a hard mask oxide layer during a recessed channel array transistor (RCAT) process.

In accordance with one aspect of the present invention, there is provided a method for fabricating a semiconductor device with a plurality of recessed channel regions, including the steps of: forming a plurality of device isolation layers in a substrate; forming a hard mask nitride layer, a hard mask oxide layer and a hard mask polysilicon layer on the device isolation and the substrate, thereby obtaining a hard mask pattern; forming a plurality of trenches in the predetermined regions of the substrate with use of the hard mask pattern to expose a plurality of recessed channel regions; selectively removing the hard mask pattern; and forming a plurality of gate structures in the plurality of trenches.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device with a plurality of recessed channel regions in accordance with a preferred embodiment of the present invention will be described in detail with reference to the accompanying drawings.

FIGS. 3A to 3E are cross-sectional views illustrating a method for forming a semiconductor device by using a recessed channel array transistor (RCAT) technology in accordance with the present invention.

Figure 1A:
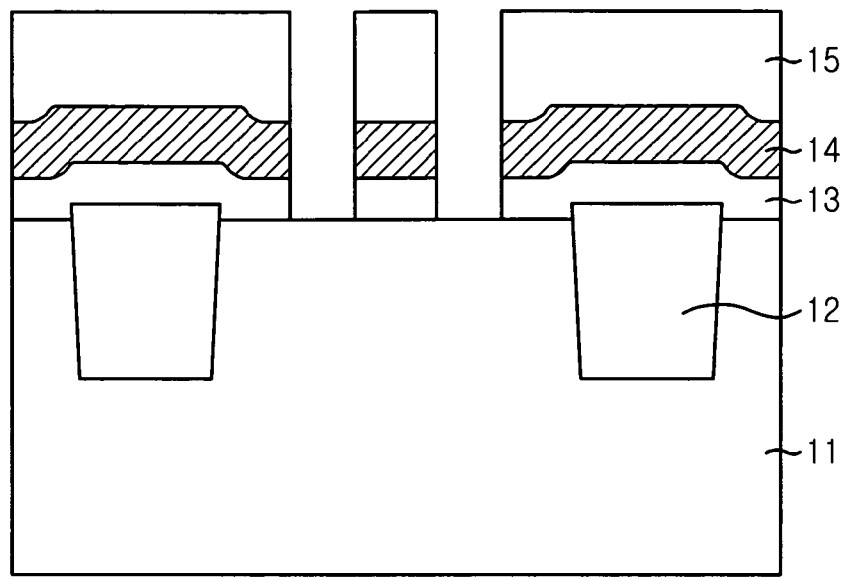
FIGS. 1A to 1C are cross-sectional views illustrating a conventional method for fabricating a semiconductor device by using a recessed channel array transistor (RCAT) technology.
Figure 1B:
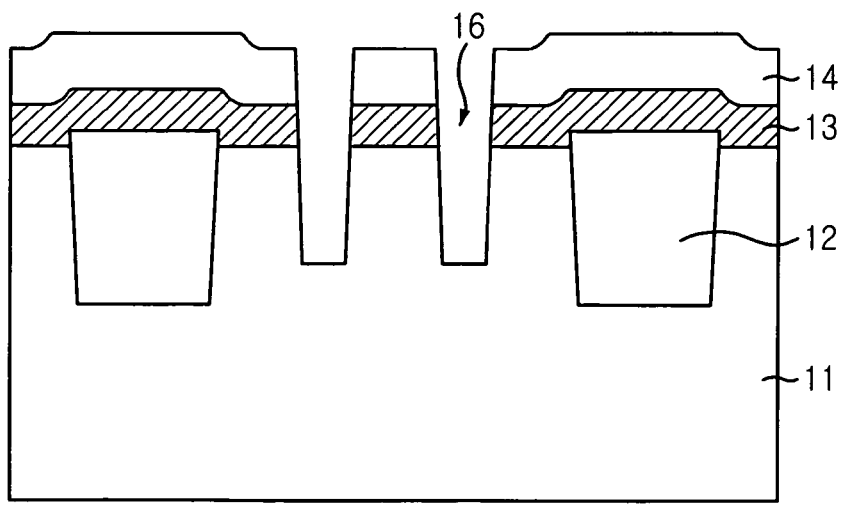
Figure 1C:
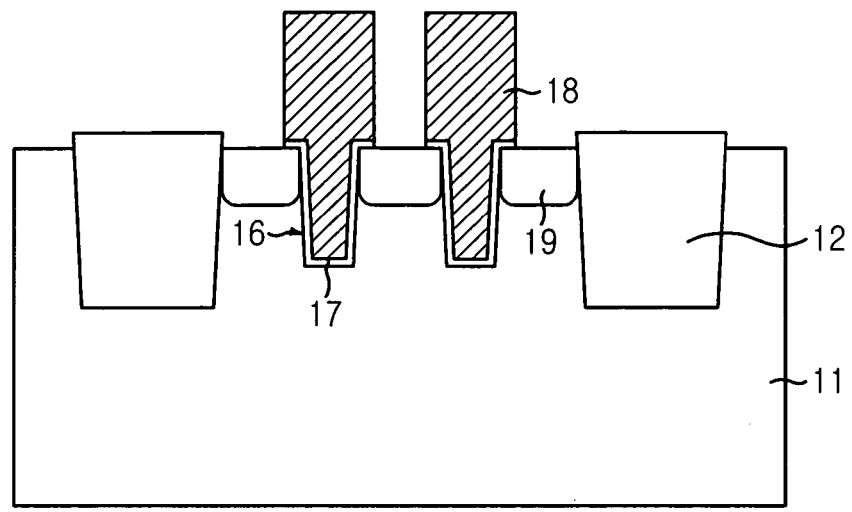
Figure 2A:
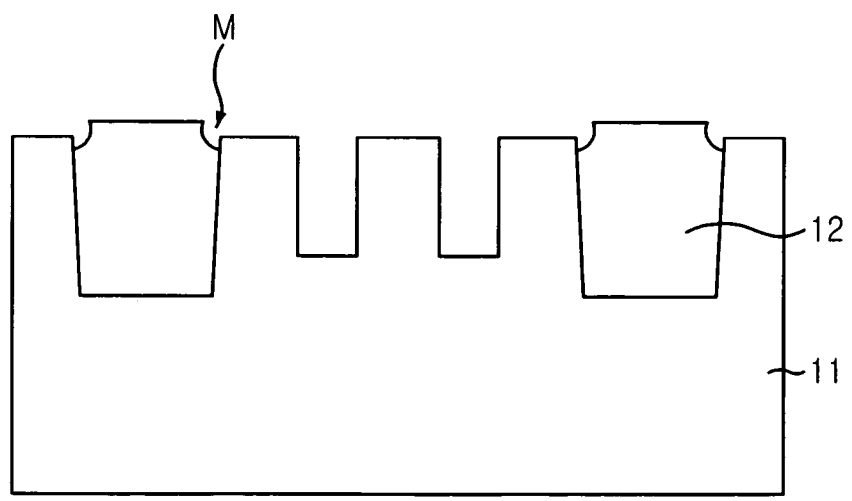
FIG. 2A is a cross-sectional view illustrating a plurality of moats M generated in accordance with the conventional method.
Figure 2B:
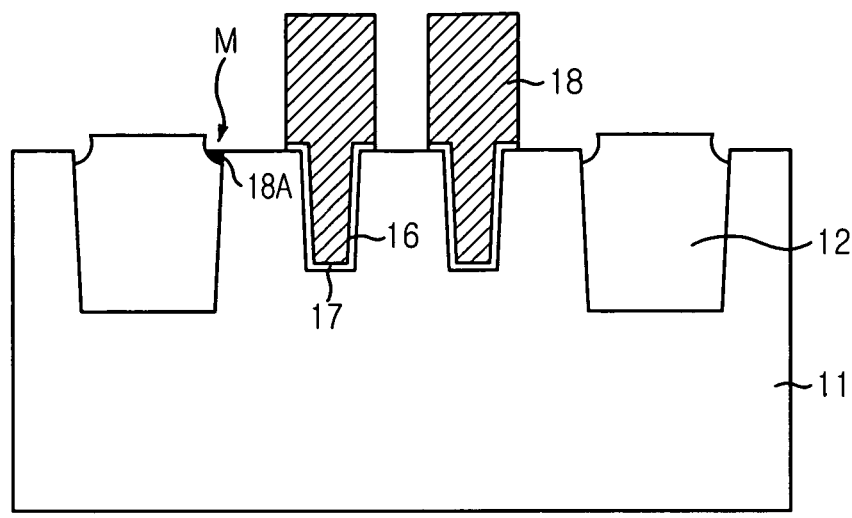
FIG. 2B is a cross-sectional view illustrating remaining layers used for forming a plurality of gate structures in accordance with the conventional method.
Figure 3A:
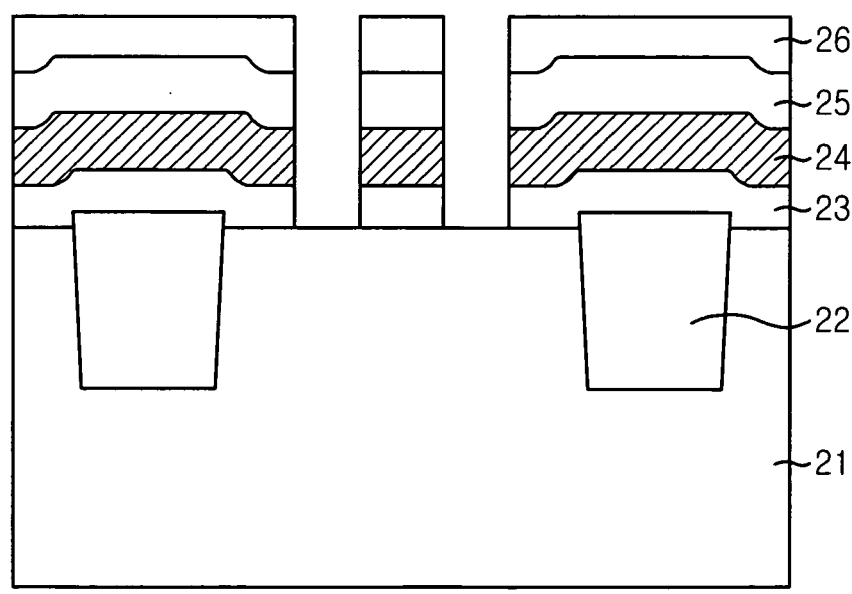
FIGS. 3A to 3E are cross-sectional views illustrating a method for forming a semiconductor device by using a RCAT technology in accordance with the present invention.

Referring to FIG. 3A, a plurality of device isolation layers for a plurality of trenches 22 are formed on a substrate 21 and then, a hard mask nitride layer 23 is formed on the substrate 21.

At this time, the hard mask nitride layer 23 is formed with silicon nitride ($Si_3N_4$) in a thickness ranging from approximately 50 Å to approximately 200 Å.

Next, a hard mask oxide layer 24 and a hard mask polysilicon layer 25 are sequentially deposited on the hard mask nitride layer 23. Herein, the hard mask oxide layer 24 is made of silicon oxide ($SiO_2$) and a thickness of the hard mask oxide layer 24 ranges from approximately 50 Å to approximately 200 Å. The hard mask polysilicon layer 25 is made of a polysilicon layer used for a typical process for fabricating a semiconductor and it is preferable that a thickness of the hard mask polysilicon layer ranges from approximately 500 Å to approximately 2,000 Å.

As described above, a structure of the hard mask for forming a recessed channel region in accordance with the present invention is a triple structure formed by stacking the hard mask nitride layer 23, the hard mask oxide layer 24 and the hard mask polysilicon layer 25. Herein, the hard mask nitride layer 23 is used as an etch stop layer during etching of the hard mask oxide layer 24 as well as serving a role of the hard mask for forming the recessed channel region.

Next, a photosensitive layer is formed on the hard mask polysilicon layer 25. And then, the photosensitive layer is patterned through photo-exposing and developing processes, thereby obtaining a mask 26.

Subsequently, the hard mask polysilicon layer 25, the hard mask oxide layer 24 and the hard mask nitride layer 23 are sequentially etched by using the mask 26 as an etch barrier, thereby exposing a plurality of recessed channel regions in the substrate 21.

In another way, the hard mask polysilicon layer 25 is first etched by using the mask 26 as the etch barrier. Afterwards, the mask 26 is removed and then, the hard mask oxide layer 24 and the hard mask nitride layer 23 are etched by using the hard mask polysilicon layer 25 as the etch barrier.

Figure 3B:
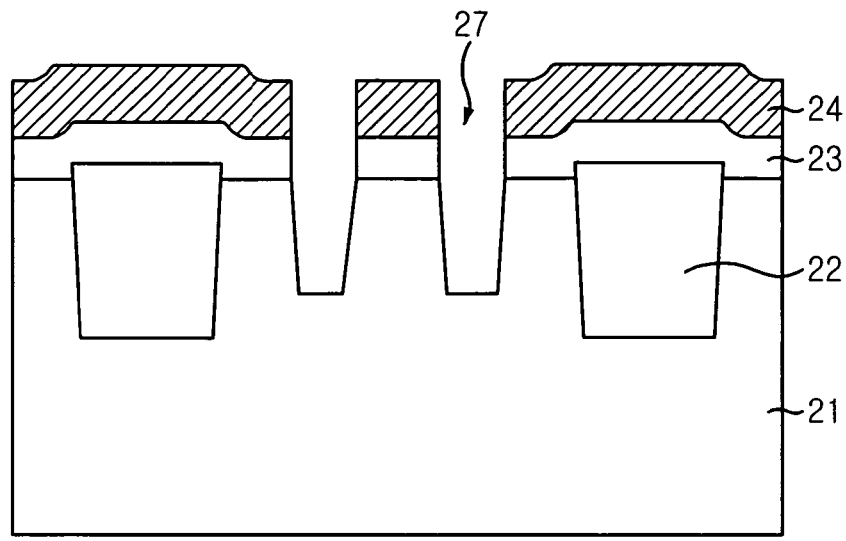

Referring to FIG. 3B, a plurality of trenches 27 are formed by etching the plurality of exposed recessed channel regions in a predetermined thickness. During forming the plurality of trenches 27, the hard mask polysilicon layer 25 and the mask 26 are all used up and the hard mask nitride layer 23 and the hard mask oxide layer 24 remain.

Figure 3C:
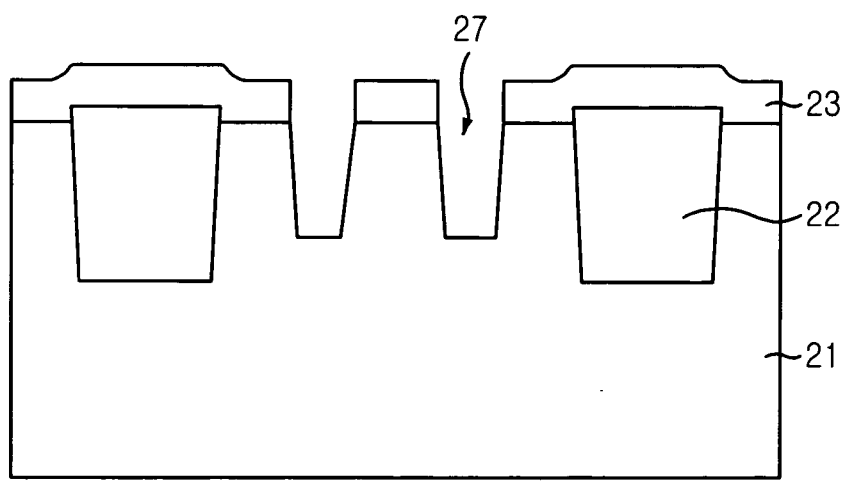

Referring to FIG. 3C, the hard mask oxide layer 24 is wet etched by using the hard mask nitride layer 23 as an etch stop layer. At this time, hydrogen fluoride (HF) solution is used for wet etching the hard mask oxide layer 24. The HF solution has a property that cannot etch a nitride layer so that the hard mask nitride layer 23 can sufficiently serve a role of the etch stop layer.

Figure 3D:
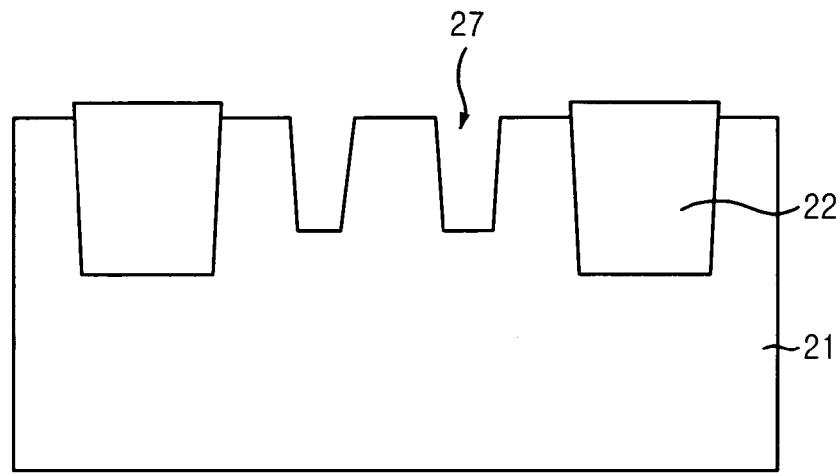

Referring to FIG. 3D, the hard mask nitride layer 23 is wet etched. At this time, the hard mask nitride layer 23 is wet etched by using phosphoric acid ($H_3PO_4$) solution. However, the plurality of device isolation layers 22 are not etched since the plurality of device isolation layers 22 that are oxide layers do not have a selective ratio to the $H_3PO_4$ solution.

Meanwhile, the hard mask nitride layer 23 can be removed by using a selective dry etching process besides the wet etching process. At this time, a chlorine gas is used for the selective dry etching process.

Figure 3E:
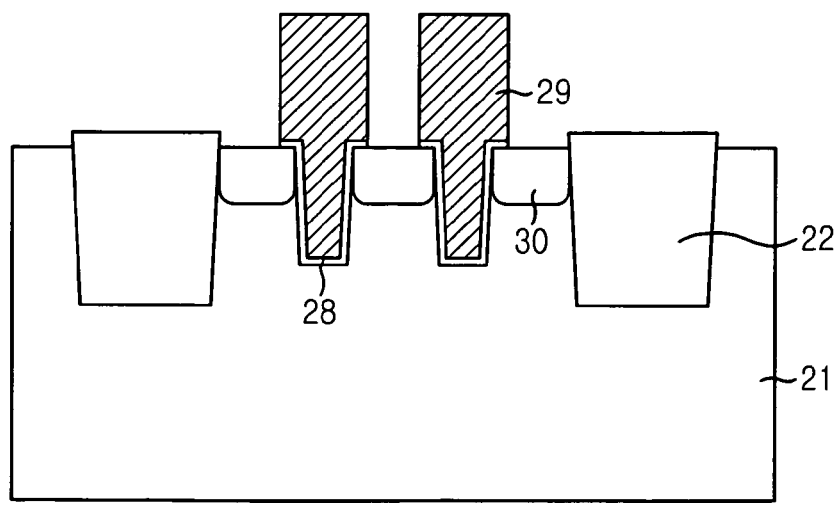

Referring to FIG. 3E, a plurality of gate oxide layers 28 are formed in a manner to surround the plurality of trenches 27. Afterwards, conductive layers for a plurality of gate structures are deposited until filling the plurality of trenches 27 on the plurality of gate oxide layers 28.

Next, the conductive layers for the plurality of gate structures and the plurality of gate oxide layers 28 are selectively patterned, thereby forming a plurality of gate structures 29. At this time, each of the gate structures 29 includes a lower region buried into the trench and an upper region projected over the substrate 21. Accordingly, the plurality of recessed channel regions are formed by the lower region of the gate structures.

Next, a plurality of source/drain regions 30 are formed on the substrate 21 by performing an ion implantation.

In accordance with the embodiment of the present invention, when the hard mask oxide layer 24 is wet etched, it is possible to prevent the plurality of device isolation layers 22 from etching since the hard mask nitride layer 23 serves a role of the etch stop layer. Accordingly, a plurality of moats are not generated in top corner edges of the plurality of device isolation layers 22.

The present invention helps to easily perform an etching process subjected to a plurality of gate structures without any residual layers by using a hard mask nitride layer to prevent a moat generation in top corner edges of a plurality of device isolation layers, thereby providing an effect of improving a property of a device.

The present application contains subject matter related to the Korean patent application No. KR 2004-0031938, filed in the Korean Patent Office on May 6, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device with a plurality of recessed channel regions, comprising the steps of:

forming a plurality of device isolation layers in a substrate;

forming a hard mask nitride layer, a hard mask oxide layer and a hard mask polysilicon layer on the device isolation and the substrate, thereby obtaining a hard mask pattern to expose a plurality of recessed channel regions;

forming a plurality of trenches by etching the plurality of recessed channel regions of the substrate with use of the hard mask pattern;

selectively etching the hard mask oxide layer by using the hard mask nitride layer as an etch stop layer and selectively etching the hard mask nitride layer; and forming a plurality of gate structures in the plurality of trenches.

2. The method of claim 1, wherein the hard mask oxide layer is removed by a wet etching process.

3. The method of claim 2, wherein the wet etching process for removing the hard mask oxide layer is performed by using a HF solution.

4. The method of claim 1, wherein the hard mask nitride layer is removed by one of a wet etching process and a dry etching process.

5. The method of claim 4, wherein the wet etching process for removing the hard mask nitride layer is performed by using a $H_3PO_4$ solution.

6. The method of claim 1, wherein the hard mask nitride layer is formed in a thickness ranging from approximately 50 Å to approximately 200 Å.

7. The method of claim 1, wherein the hard mask oxide layer is formed in a thickness ranging from approximately 50 Å to approximately 200 Å.

8. The method of claim 1, before the step of forming the gate structure patterns further comprising the step of forming a gate oxide layer on the trenches.

* * * * *

UNITED STATES PATENT AND TRADEMARK OFFICE
CERTIFICATE OF CORRECTION

PATENT NO. : 7,232,727 B2  Page 1 of 1
APPLICATION NO. : 11/030438
DATED : June 19, 2007
INVENTOR(S) : Park It is certified that error appears in the above-identified patent and that said Letters Patent is hereby corrected as shown below:

Title Page;
In Item [56], Other Publications, Line #1, please insert -- time -- following "retention".

Col. 5, line 18;
In Claim # 3, Line #3, please delete "a".

Col. 6, line 6;
In Claim # 5, Line #3, please delete "a".

Signed and Sealed this

Thirtieth Day of October, 2007

JON W. DUDAS
*Director of the United States Patent and Trademark Office*